US011800282B1

(12) United States Patent
Edwards et al.

(10) Patent No.: US 11,800,282 B1
(45) Date of Patent: Oct. 24, 2023

(54) VARIABLE VOLTAGE PHANTOM POWER SUPPLY ASSEMBLY AND A METHOD FOR CUSTOMIZING PERFORMANCE CHARACTERISTICS OF A MICROPHONE

(71) Applicant: Copperline Ranch, Inc., Hermitage, TN (US)

(72) Inventors: William N. Edwards, Hermitage, TN (US); Eric Strouth, St. Louis, MO (US); John J. Sicilian, Miami, FL (US)

(73) Assignee: COPPERLINE RANCH, Hermitage, TN (US)

( * ) Notice: Subject to any disclaimer, the term of this patent is extended or adjusted under 35 U.S.C. 154(b) by 0 days.

(21) Appl. No.: 16/514,593

(22) Filed: Jul. 17, 2019

(51) Int. Cl.
| H04R 3/00 | (2006.01) |
| H03F 3/68 | (2006.01) |
| H04R 19/01 | (2006.01) |
| H03F 99/00 | (2009.01) |
| H04R 1/22 | (2006.01) |

(Continued)

(52) U.S. Cl.
CPC .............. *H04R 3/00* (2013.01); *H03F 3/68* (2013.01); *H03F 99/00* (2022.08); *H04R 1/222* (2013.01); *H04R 19/016* (2013.01); *H04R 19/04* (2013.01); *H04R 21/02* (2013.01); *H04R 2410/00* (2013.01)

(58) Field of Classification Search
CPC ........ H04R 3/00; H04R 19/016; H04R 19/04; H04R 11/04; H04R 21/02; H04R 1/222; H04R 2410/00; H03F 99/00; H03F 3/68
See application file for complete search history.

(56) References Cited

U.S. PATENT DOCUMENTS 9,306,519 B1 * 4/2016 Cloud ...................... H03F 3/68
9,413,259 B1 * 8/2016 Vinciarelli .......... H02M 3/1584
(Continued)

FOREIGN PATENT DOCUMENTS

JP 2006352639 A * 12/2006
KR 200430825 Y1 * 11/2006

OTHER PUBLICATIONS

Shure, Mute Switch with phantom power (Year: 2016).*
(Continued)

*Primary Examiner* — Carolyn R Edwards
*Assistant Examiner* — Kuassi A Ganmavo
(74) *Attorney, Agent, or Firm* — Paul D. Strain, Esq.; Strain & Strain PLLC

(57) ABSTRACT

A variable voltage phantom power supply assembly includes a phantom power supply unit having a power input, and one or more audio channels. The variable voltage phantom power supply assembly also includes a variable voltage phantom power supply module having a phantom power supply circuit with a variable voltage controller and a variable voltage phantom power output. A method of customizing at least one performance characteristic of a microphone includes: modifying a phantom power supply to provide a variable voltage phantom power output; connecting a microphone to an input of a variable voltage phantom power supply assembly; adjusting the voltage output of the variable voltage phantom power supply to the microphone; monitoring the performance characteristics of the microphone; and, readjusting the voltage output of the variable voltage phantom power supply to the microphone to obtain at least one desired performance characteristic of the microphone.

16 Claims, 9 Drawing Sheets

(51) Int. Cl.
*H04R 19/04* (2006.01)
*H04R 21/02* (2006.01)

(56) References Cited

U.S. PATENT DOCUMENTS

| | | | | |
|---|---|---|---|---|
| 9,668,045 | B1* | 5/2017 | Cloud | H03F 3/185 |
| 2005/0231873 | A1* | 10/2005 | Nell | H04R 3/00 |
| | | | | 361/92 |
| 2006/0291672 | A1* | 12/2006 | Akino | H04R 3/00 |
| | | | | 381/111 |
| 2008/0101630 | A1* | 5/2008 | Akino | H04R 19/04 |
| | | | | 381/190 |
| 2010/0290649 | A1* | 11/2010 | Hibbing | H04R 3/00 |
| | | | | 381/174 |
| 2010/0303260 | A1* | 12/2010 | Stieler von Heydekampf | |
| | | | | H04H 60/04 |
| | | | | 381/119 |
| 2011/0228954 | A1* | 9/2011 | Saulespurens | H04R 3/00 |
| | | | | 381/113 |
| 2012/0014541 | A1* | 1/2012 | Nakayama | H03F 3/45475 |
| | | | | 381/111 |
| 2012/0321106 | A1* | 12/2012 | Chang | H03F 3/181 |
| | | | | 381/120 |
| 2014/0253072 | A1* | 9/2014 | Hussien | H02M 1/36 |
| | | | | 323/281 |
| 2017/0034616 | A1* | 2/2017 | Yoshino | H04R 1/38 |
| 2017/0064449 | A1* | 3/2017 | Furuya | H04R 3/00 |
| 2018/0084325 | A1* | 3/2018 | Goeke | H04R 1/04 |

OTHER PUBLICATIONS

RDL, Dual Phantom Adapter (Year: 2017).*
Power Design, 48V Phantom Microphone Power Supply (Year: 2013).*
TI, TL783 Voltage Adjustable Regulator (Year: 2015).*
RDL, Model HR MP2 Dual Microphone Amplifier (Year: 2017).*
Component101, Electret Condenser Microphone, Jan. 2018 (Year: 2018).*

* cited by examiner

| Microphone Model | Breakdown Voltage (V min) | Low Voltage Usability Threshold | Low Voltage Characteristics | High Voltage (V max) | High Voltage Characteristic |
|---|---|---|---|---|---|
| Neumann U47 FET | 25.24 | 26.66 - 28.76 | Incredibly clean, very natural sounding to the original source, no noise, slight loss of high end. | 52.40 | Slightly brighter. Nice overall feel. |
| Neumann SM 69 | 2.45 | 8.7 | Interesting, weird low mid boost and less mids, soft white noise, much less highs. | 50.32 | Less mid boost. Slightly more high end. |
| AKG 414 B-ULS | 3.22 | 4.49 | Somewhat clean but a little woofy, low noise, slight boost in lows and mids, slight drop in highs. | 52.14 | Average. Not much different than normal. |
| MXL V 67 N | 15.44 | 17.29 | Not as smooth, moderate noise no buzz, slight bass boost. | 51.80 | No noise at all. Clean and crisp. |
| MXL CR 89 | 2.89 | 3.74 - 4.93 | More boxy, low noise/buzz, more lows and low mids present. | 51.74 | Less lows, slight boost in mirage. |
| Miktek C5 | 32.1 | 33.94 - 35.98 | Somewhat clean but buzzy, more bass and even more brightness. | 50.89 | No buzz. Less brightness than at breakdown. |
| Audio Technica 3527 | 11.91 | 13.16 - 15.41 | Moderate clarity, very buzzy, slightly brighter. | 49.98 | No buzz. Clean. Slight mid/high boost. |
| Shure SM 81 | 1.7 | 6.9 | Warm and crispy, no noise, slightly more bass. | 52.75 | Less bass but natural. |
| Shure Beta 98H | 2.02 | 3.83 | Pretty smooth, distortion is a pretty white noise not a buzz, barely brighter. | 52.39 | Not much different than at 48v. |
| C12 ADK Capsule | 8.74 | 9.24 - 13.21 | Very natural and clean, very low noise, slight high rolloff. | 49.93 | Brighter high end, almost too much. |
| U67 ADK Capsule | 8.77 | 9.23 - 13.18 | Slightly boxy around 200-400, very low noise, loss of lows, more loss of highs. | 51.84 | Slight hum in the high end. |
| SEE Voodoo2 | 4.32 | 7.51 | Kinda muffled, ugly white noise and buzz, much more bass present. | 52.12 | Much cleaner than at breakdown. Nice crisp highs. |

FIG. 9

VARIABLE VOLTAGE PHANTOM POWER SUPPLY ASSEMBLY AND A METHOD FOR CUSTOMIZING PERFORMANCE CHARACTERISTICS OF A MICROPHONE

BACKGROUND OF THE INVENTION

Field of the Invention

The present invention is directed to a variable voltage phantom power supply assembly utilized to provide a phantom power supply to a microphone. The present invention is further directed to a method for customizing one or more performance characteristics of a microphone by way of a variable voltage output phantom power supply assembly.

Description of the Related Art

Phantom power is a positive voltage which is required by certain microphones, e.g., condenser microphones, in order to operate the active electronics therein. In at least some instances, and in particular, with modern audio recording equipment, the output from a condenser microphone has a very high impedance, and a powered circuit is required to reduce the impedance of the audio signals generated by and transmitted from the microphones.

The name phantom power is a reference to the fact that electrical power is supplied to the microphone through the same cable through which audio signals generated by and transmitted from the microphone flow. As one example, phantom power runs through pins 2 and 3 of a standard XLR microphone cable. Currently, a phantom power supply typically supplies an output voltage of either 12 or 48 volts. However, the performance characteristics of a microphone can vary widely, depending on the voltage provided via a phantom power supply.

On occasion, a recording engineer will elect to integrate one or more vintage audio recording components, whether a microphone, compressor, preamplifier, etc., into a modern audio recording environment in order to capture a specific audio characteristic of a particular vintage audio recording component. However, as will be appreciated by those of skill in the art, compatibility issues often arise. As one example, older audio recording equipment typically produce an audio output signal having a relatively low impendence, typically in the range of about 600 to 825 ohms, whereas modern audio recording equipment may have bridging impedances of 10,000 ohms or more. In some cases, audio recording equipment may produce audio output signals that has a reversed polarity from other audio recording components in an audio recording environment, in which case, a reversal of the polarity of the audio output signal will be required for compatibility. In addition, vintage audio recording equipment typically produces a much "hotter" audio output signal than modern audio recording equipment, thus requiring some form of attenuation of an audio output signal from vintage audio recording equipment to be compatible with modern audio recording equipment components.

As such, it would be highly beneficial to provide a phantom power supply wherein the voltage output of the phantom power supply is variably adjustable from at least a breakdown voltage to a maximum high voltage limit for a particular microphone, thus allowing the performance characteristics of the microphone to be customized. It would also be helpful for such a phantom power supply to incorporate an impedance adjustment circuit to provide a compatible interface for low impendence vintage audio recording equipment. A further benefit may be realized by inclusion of a reverse polarity circuit to allow for reversal of the polarity of an audio signal as may be required when a particular audio recording component produces an audio signal having a reversed polarity relative to other audio recording components being utilized. Further advantages may be achieved by incorporating additional features into a variable voltage phantom power supply, such as a mute circuit, a high pass filter circuit, and/or an attenuation circuit, such as may be required to render an audio signal from a vintage audio recording component compatible in a modern recording environment.

SUMMARY OF THE INVENTION

The present invention is directed to a variable voltage phantom power supply assembly comprising a phantom power supply unit having a power input. The phantom power supply unit includes at least one audio channel, however, in accordance with at least some embodiments, a phantom power supply unit comprises a plurality of channels. As will be appreciated by those of skill in the art, the number of audio channels in a phantom power supply unit in accordance with the present invention is non-limiting.

In accordance with at least one embodiment of the present invention, a phantom power supply unit further comprises at least one ancillary circuit. An ancillary circuit may include, but is in no manner limited to, an impedance adjustment circuit, a reverse polarity circuit, an attenuation circuit, a high pass filter circuit, a mute circuit, etc. In one further embodiment, a phantom power supply unit comprises a plurality of ancillary circuits.

A variable voltage phantom power supply assembly in accordance with the present invention also includes a variable voltage phantom power supply module including a phantom power supply circuit. The variable voltage phantom power supply module also includes a variable voltage controller and a variable voltage phantom power output. As such, the variable voltage phantom power supply module may be utilized to provide a phantom power voltage output over a range of preselected phantom power voltages via a variable voltage phantom power output.

The present invention is further directed to a method of customizing at least one performance characteristic of a microphone. In accordance with at least one embodiment of the present invention, the method includes: modifying a phantom power supply to provide a variable voltage phantom power output; connecting a microphone to an input of a variable voltage phantom power supply assembly; adjusting the voltage output of the variable voltage phantom power supply to the microphone; monitoring the performance characteristics of the microphone; and, readjusting the voltage output of the variable voltage phantom power supply to the microphone to obtain at least one desired performance characteristic of the microphone.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which:

FIG. 9 is a table illustrative of performance characteristics attained from various commercially available microphones operated in accordance with the present invention.

Like reference numerals refer to like parts
throughout the several views of the drawings.

DETAILED DESCRIPTION

Figure 1:
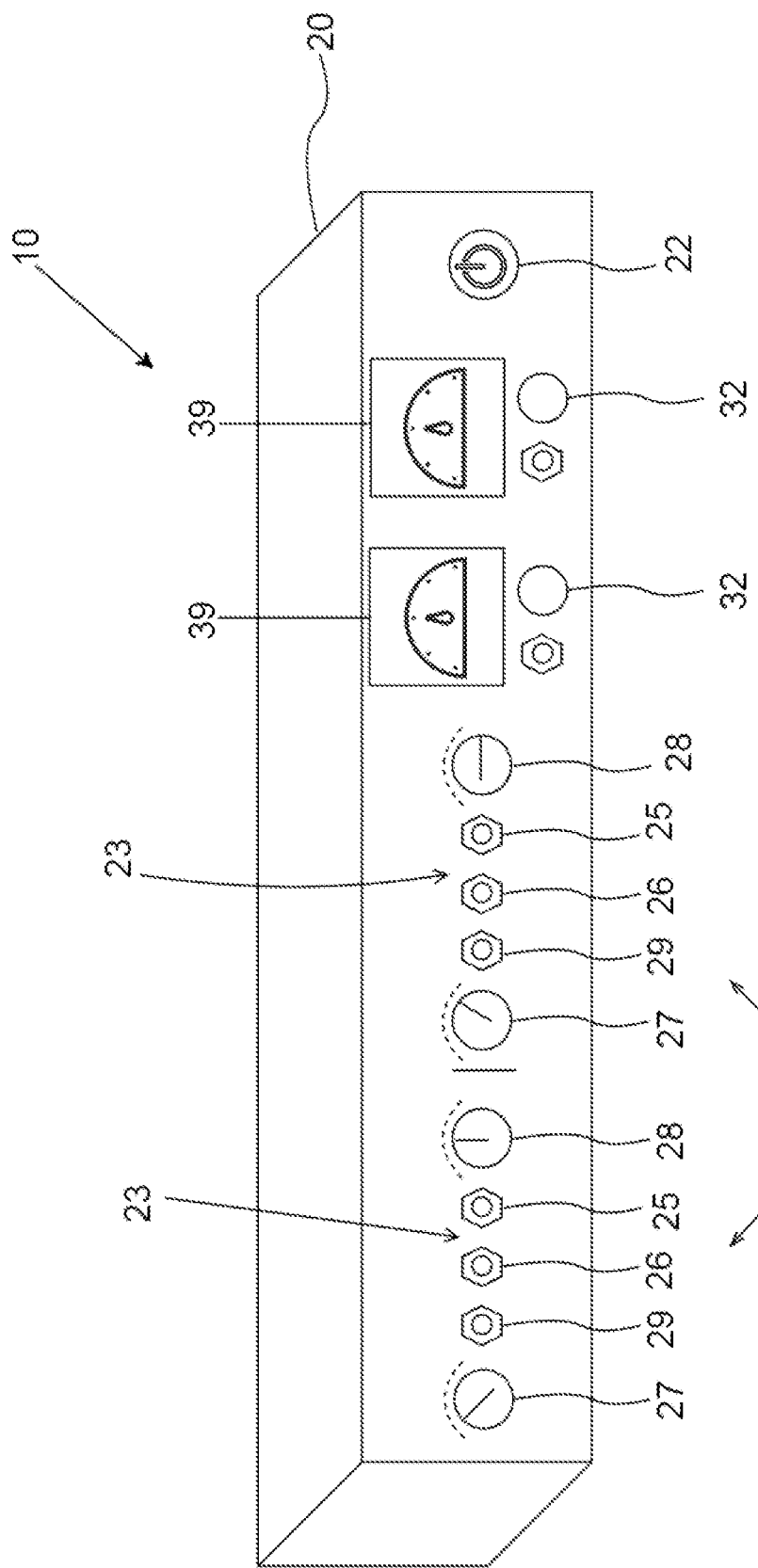
FIG. 1 is a front perspective view of one embodiment of a variable voltage phantom power supply assembly in accordance with the present invention.
Figure 2:
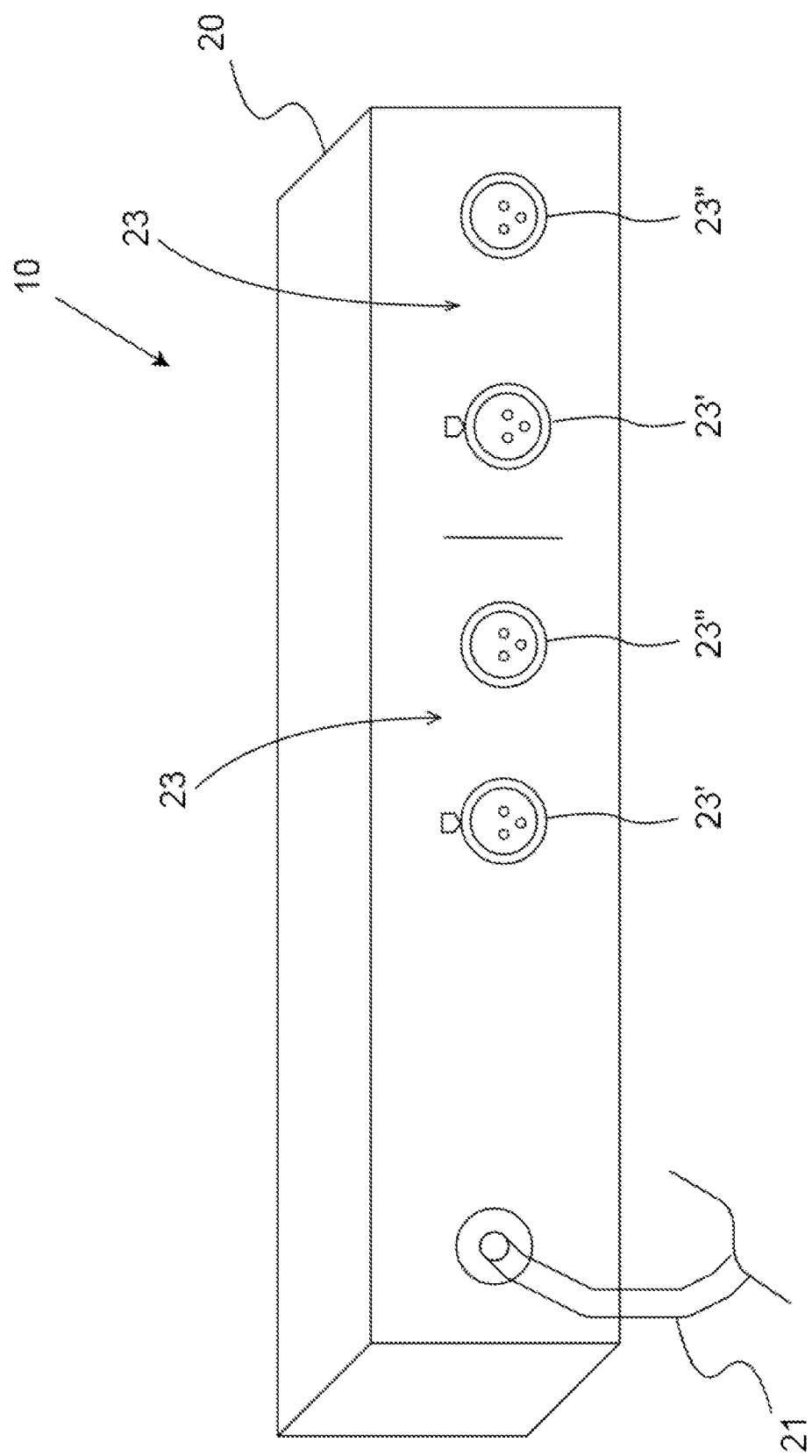
FIG. 2 is a rear perspective view of one embodiment of a variable voltage phantom power supply assembly in accordance with the present invention.

As stated above, the present invention comprises a variable voltage phantom power supply assembly generally as shown as at 10 throughout the figures. With reference to the illustrative embodiments of FIGS. 1 and 2, a variable voltage phantom power supply assembly 10 in accordance with the present invention comprises a phantom power supply unit 20. The phantom power supply unit 20 includes a power input 21, such as is shown in FIG. 2, which is illustrative of a rear panel of one embodiment of a phantom power supply unit 20 in accordance with the present invention. As shown in FIG. 1, which is illustrative of a front panel of one embodiment of a phantom power supply unit 20 in accordance with the present invention, the phantom power supply unit 20 includes a power switch 22.

In accordance with at least one embodiment of the present invention, a phantom power supply unit 20 comprises at least one audio channel 23. As shown in the illustrative embodiment of FIG. 2, a phantom power supply unit 20 comprises a plurality of audio channels 23. As further shown in FIG. 2, each of the plurality of audio channels 23 comprises an input jack 23' and an output jack 23". As will be appreciated by those of skill in the art, a phantom power supply unit 20 in accordance with the present invention is operable utilizing any number of audio signal input jacks 23' and audio output jacks 23". In at least one embodiment, a phantom power supply unit 20 comprises 3 pin XLR input jacks 23' and output jacks 23", as are commonly known and utilized in the audio recording industry.

Figure 5:
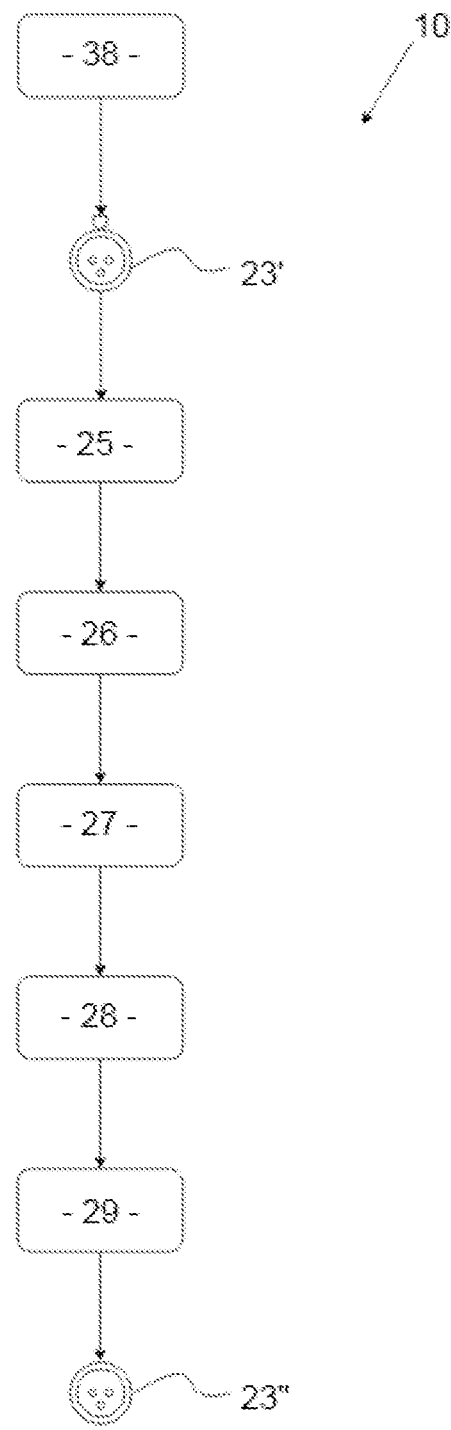
FIG. 5 is a diagrammatic representation of one illustrative embodiment of an audio signal path through a variable voltage phantom power supply assembly in accordance with the present invention.

A phantom power supply unit 20 in accordance with at least one embodiment of the present invention further comprises at least one ancillary circuit 24. Looking once again to the illustrative embodiment of FIG. 1, a phantom power supply unit 20 in accordance with the present invention comprises at least one ancillary circuit 24 per audio channel 23. FIG. 5 is illustrative of one embodiment of an audio signal path through a variable voltage phantom power supply assembly 10 in accordance with the present invention.

As one example, an ancillary circuit 24 may comprise an impedance adjustment circuit which is operable via an impedance adjustment circuit switch 25 as shown in the illustrative embodiment of FIG. 1. More in particular, an impedance adjustment circuit comprises one or more resistors which provide an impedance in the range of about 600 ohms to about 825 ohms, similar to the impedance of an audio signal output from numerous vintage audio recording components including, but not limited to, microphones, preamplifiers, compressors, etc. Thus, when a vintage audio recording component, such as, by way of example only, a Urei LA-3a compressor or an Ampex 351 microphone preamplifier, is connected to the phantom power supply unit 20 via input jack 23' of a first audio channel 23, a corresponding impedance adjustment circuit may be activated via a corresponding impedance adjustment circuit switch 25 such that the impedance of the audio signal output from the vintage audio recording component is matched in the phantom power supply unit 20, thereby allowing seamless integration of the audio signal output from the vintage audio recording component with the other components in a particular audio recording environment.

Figure 6:
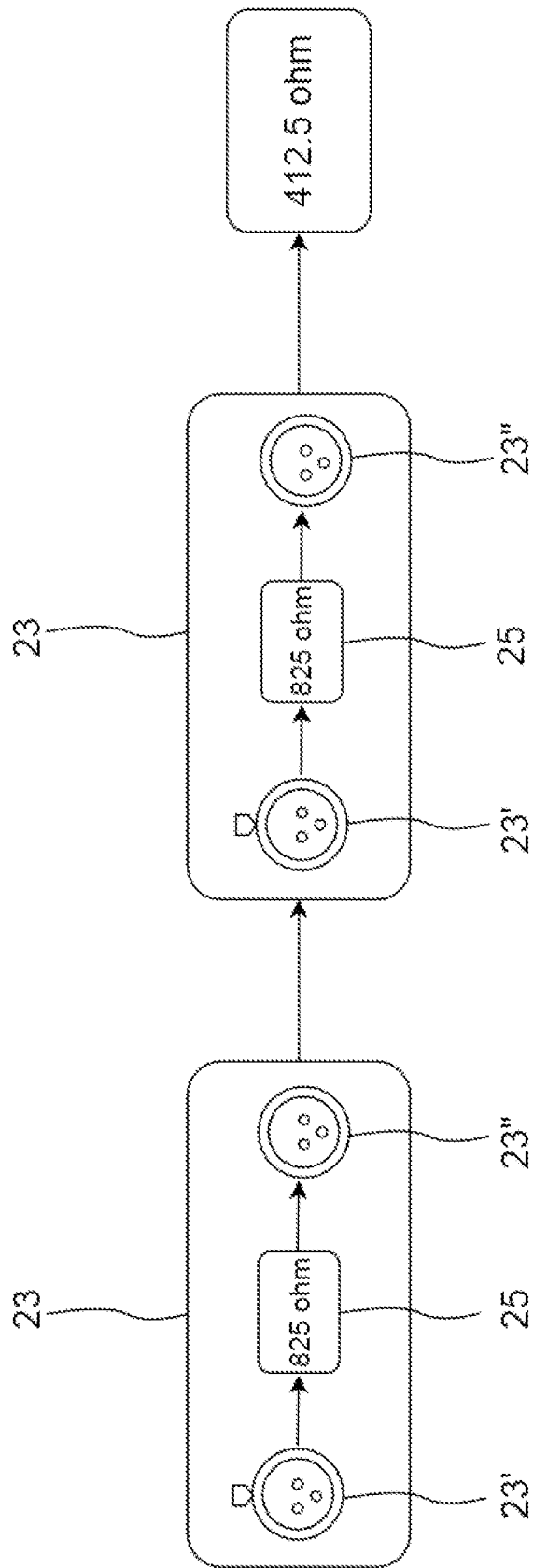
FIG. 6 is a diagrammatic representation of one illustrative embodiment of stacking an audio signal through impedance adjustment circuits of a variable voltage phantom power supply assembly in accordance with the present invention.

Of course, it is possible that the impedance of an audio signal output from a particular vintage audio recording component is less than 825 ohms, or even less than 600 ohms. In such a case, the present variable voltage phantom power supply assembly 10 allows for stacking multiple channels in series as needed to attain an impedance which more closely matches the impedance of an audio signal output from a particular vintage audio recording component. As one example, if an impedance adjustment circuit in a first audio channel 23 is set to 825 ohms and an impedance adjustment in a second audio channel 23 is also set to 825 ohms, when a signal is routed through the first audio channel 23 and the second audio channel 23 in series, the audio signal sees an impedance of 412.5 ohms, such as is shown in the illustrative embodiment of FIG. 6.

With continued reference to the illustrative embodiment of FIG. 1, an ancillary circuit 24 in accordance with the present invention may comprise a reverse polarity circuit which is actuated via a reverse polarity circuit switch 26. As will be appreciated by those of skill in the art, audio output signals generated by different audio recording components, whether vintage or modern audio recording equipment, are not always in sync with other components in terms of the signal polarity. As such, in accordance with at least one embodiment, a phantom power supply unit 20 comprises a reverse polarity circuit which is actuated via a reverse polarity circuit switch 26 to reverse the polarity of an audio signal from a particular audio recording component which is fed into an input jack 23' of an audio channel 23 such that the polarity of the audio output signal at a corresponding output jack 23" is in sync with the polarity of the audio output signals produced by the other audio recording components in a particular audio recording environment.

As previously stated, in general, vintage audio recording equipment often generate "hotter" audio signal levels than corresponding modern audio recording components, which can result in incompatibility when trying to incorporate a vintage audio recording component into a modern audio recording environment. As such, in accordance with at least one embodiment of the present invention, such as is shown in FIG. 1, an ancillary circuit 24 comprises an attenuation circuit which is operable via an attenuation circuit switch 27. As before, when a vintage audio recording component, such as, by way of example only, a Gates M-5168 Twinsistor microphone preamplifier, is connected to the phantom power supply unit 20 via input jack 23' of a first audio channel 23, a corresponding attenuation circuit is activated via an attenuation circuit switch 27 such that the level of the signal from the vintage audio recording component output through a corresponding output jack 23" of the first audio channel 23 has a level which is approximately the same as the level of the audio signals generated by other audio recording components in a particular audio recording environment. In at least one embodiment, an attenuation circuit is utilized to reduce the level of an audio signal over range of 0 to –40 dB. In at least one further embodiment, an attenuation circuit switch 27 in accordance with the present invention is operable to select specific reductions in the level of attenuation to an audio signal of –15 dB, –20 dB, –30 dB or –40 dB. Of course, it will be appreciated by those of skill in the art that an attenuation circuit switch 27 may be continuously variable over range of about 0 dB to –40 dB. Therefore, the present variable voltage phantom power supply assembly 10 permits operation of vintage audio components across their full operating range, for example, across the full gain range of a vintage preamplifier, without distortion of the audio signal output therefrom into the subsequent audio recording components in a particular audio recording environment.

Figure 7:
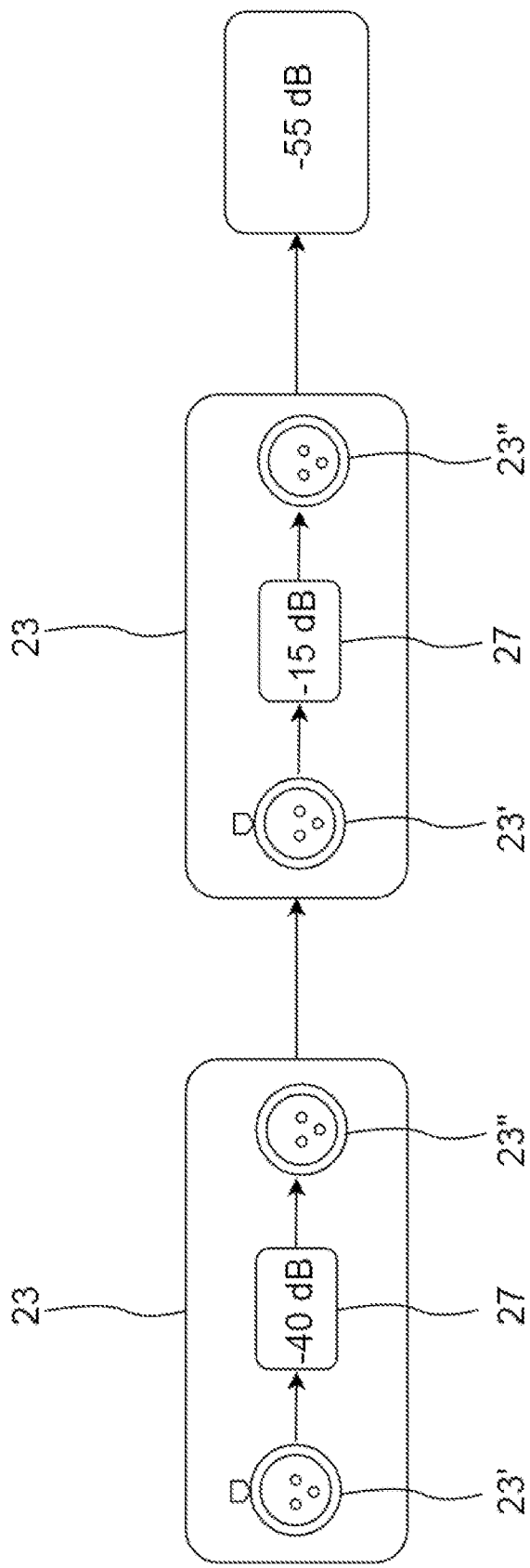
FIG. 7 is a diagrammatic representation of one illustrative embodiment of stacking an audio signal in series through attenuation circuits of a variable voltage phantom power supply assembly in accordance with the present invention.

In the event the level of an audio signal must be reduced by more than –40 dB, the present variable voltage phantom power supply assembly 10, once again, permits stacking multiple channels in series as needed to attain a required signal attenuation, such as is shown in the illustrative embodiment of FIG. 7. More in particular, the audio signal input to a first audio channel 23 via a corresponding input jack 23' is reduced by 40 dB by an attenuation circuit in the first audio channel 23, and the audio signal output from the first channel 23 is fed as an input to a second audio channel 23. The audio signal input to a second audio channel 23, in series, via a corresponding input jack 23' is reduced by an additional 15 dB by an attenuation circuit in the second audio channel 23, and the audio signal output from the second audio channel 23 is reduced a total of 55 dB.

A phantom power supply unit 20 in accordance with at least one embodiment of the present invention further comprises a high pass filter circuit such as are known in the auto recording industry to prevent low-frequency audio signals from being introduced into an audio recording. With reference once again to the illustrative embodiment of FIG. 1, each audio channel 23 comprises a high pass filter circuit switch 28 which may be utilized to actuate a corresponding high pass filter circuit in each audio channel 23. In at least one embodiment, a high pass filter circuit is utilized to set a low frequency limit for audio signals in a range of 0 to 300 Hz. In at least one further embodiment, a high pass filter circuit switch 28 in accordance with the present invention is operable to select a specific low frequency limit for audio signals of 40 Hz, 80 Hz, 150 Hz, and 300 Hz. As before, those of skill in the art will appreciate that a low pass filter circuit switch 28 may be continuously variable over range of about 0 Hz to 300 Hz, or another high pass filter frequency range.

In at least one embodiment, an ancillary circuit 24 of a phantom power supply unit 20 in accordance with the present invention comprises a mute circuit which is operable via a mute circuit switch 29, such as is shown in the illustrative embodiment of FIG. 1. Thus, a mute circuit switch 29 in accordance with the present invention is actuated to take a particular audio recording component out of line for a particular phase of an audio recording, without the need to physically disconnect the component from an audio input jack 23'.

Figure 3:
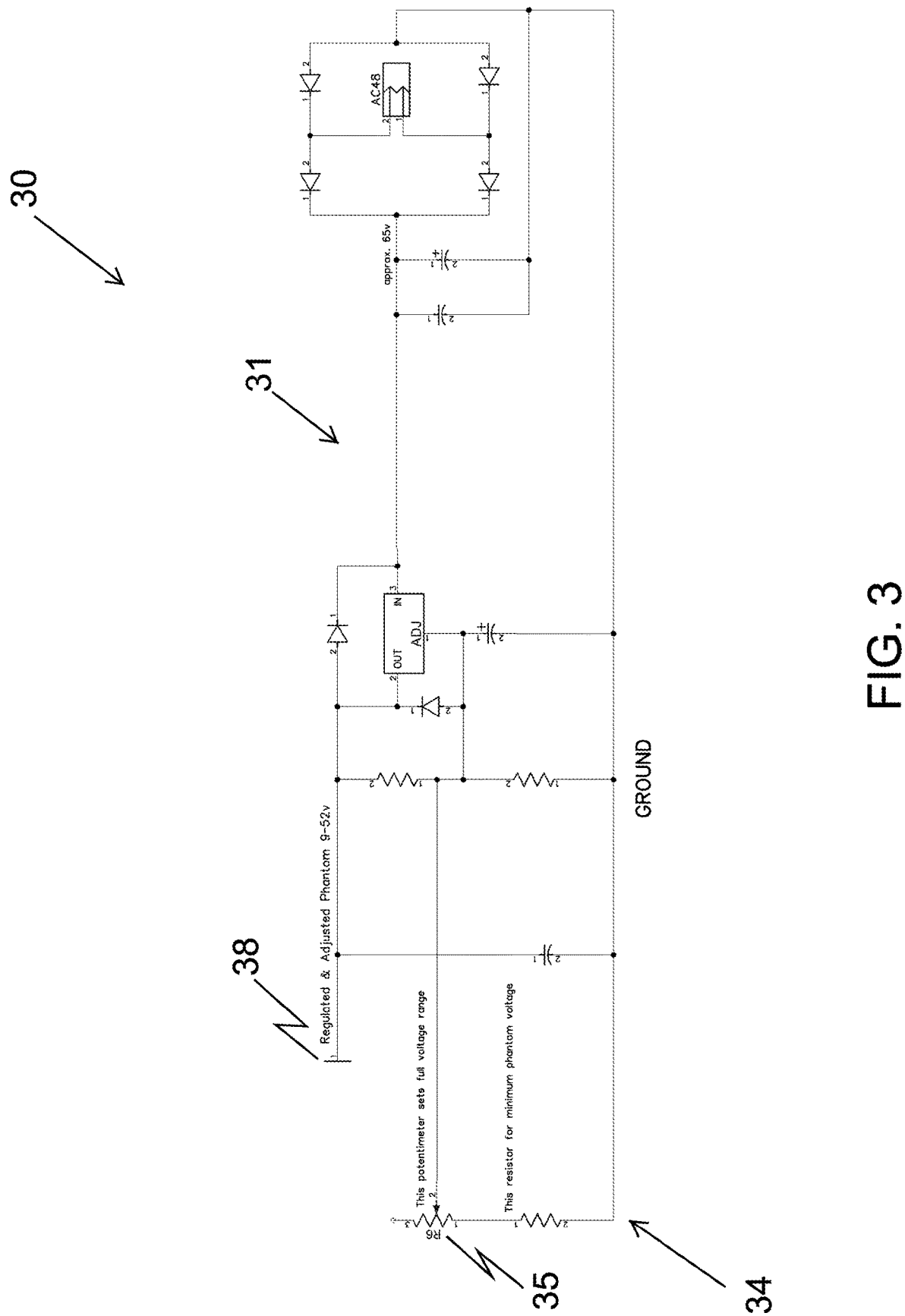
FIG. 3 is a schematic of one illustrative embodiment of a circuit diagram for a variable voltage phantom power supply module in accordance with the present invention.
Figure 4:
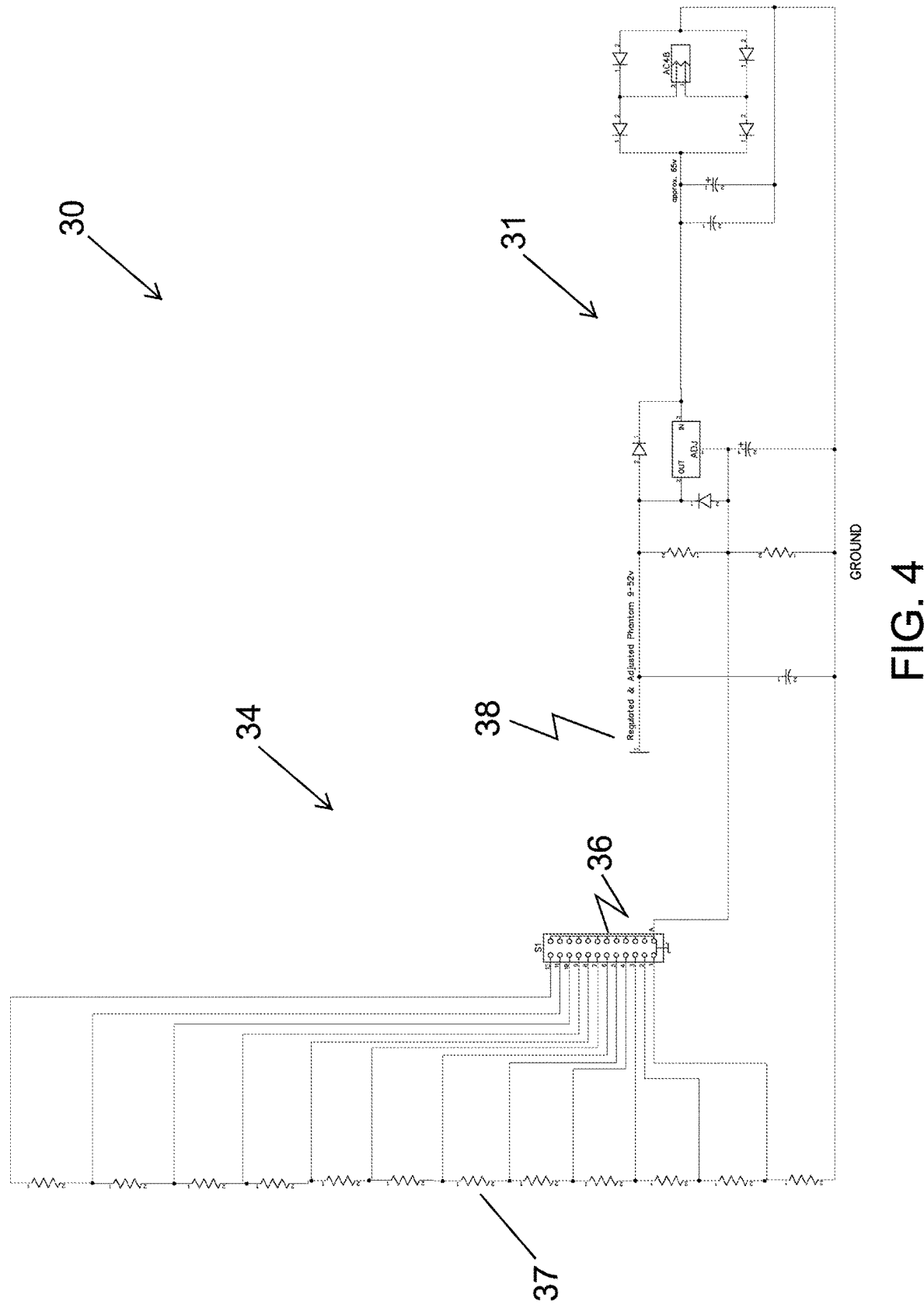
FIG. 4 is a schematic of another illustrative embodiment of a circuit diagram for a variable voltage phantom power supply module in accordance with the present invention.

A phantom power supply unit 20 of a variable voltage phantom power supply assembly 10 in accordance with the present invention further comprises a variable voltage phantom power supply module, generally as shown schematically as 30 in the illustrative embodiments of FIGS. 3 and 4. As may be seen from FIGS. 3 and 4, a variable voltage phantom power supply module 30 in accordance with the present invention includes a phantom power supply circuit 31. As will be appreciated by those of skill in the art, the phantom power supply circuit 31 presented in schematic form in the illustrative embodiments of FIGS. 3 and 4 is merely representative of any number of phantom power supply circuits 31 which may be operable with the present invention, and which are deemed included within the scope and intent of the present invention.

Looking further to the illustrative embodiments of FIGS. 3 and 4, a variable voltage phantom power supply module 30 in accordance with the present invention comprises a variable voltage controller 34. More in particular, a variable voltage controller 34 is operable via a variable voltage switch 32, as shown in the illustrative embodiment of FIG. 1, which allows the phantom power voltage output from the phantom power supply circuit 31 to be varied over a preselected phantom power voltage range. As will be appreciated from the illustrative embodiment of FIG. 1, a variable voltage phantom power supply module 30 in accordance with the present invention provides a preselected phantom power voltage to one or more audio channels 23 of a variable voltage phantom power supply assembly 10. In one embodiment, a preselected phantom power voltage is in a range of about 12 to about 48 volts DC. In one other embodiment, a preselected phantom power voltage is in a range of about 0 to about 48 volts DC. In still one further embodiment. In yet one further embodiment, a preselected phantom power voltage is in a range of about 0 to about 52 volts DC.

With reference now specifically to the illustrative embodiment of FIG. 3, a variable voltage controller 34 of a variable voltage phantom power supply module 30 comprises a potentiometer 35. The potentiometer 35 is actuable via the variable voltage switch 32, to allow selection of a phantom power voltage output over a full continuous range of preselected phantom power voltages. As before, and by way to example only, a preselected phantom power voltage may be in a range of about 12 to 48 volts DC, or from about 0 to about 48 volts DC, or from about 0 to about 52 volts DC. As further shown in the illustrative embodiment of FIG. 3, the variable voltage phantom power supply module 30 comprises a variable voltage phantom power output 38 through which a preselected phantom power voltage is supplied to an audio channel 23 of a phantom power supply unit 20 of a variable voltage phantom power supply assembly 10 in accordance with the present invention. Looking to the illustrative embodiment of FIG. 1, a preselected phantom power output voltage is displayed on a variable voltage display 39 for each corresponding audio channel 23 of a phantom power supply unit 20. As such, a preselected phantom power voltage to be supplied to one or more audio channel 23 of a variable voltage phantom power supply assembly 10 may be quickly and easily varied by way of a variable voltage controller 34 which is actuated via a variable voltage switch 32 and directly monitored via a variable voltage display 39.

Looking next to the illustrative embodiment of FIG. 4, a variable voltage controller 34 of a variable voltage phantom power supply module 30 is a ladder switch 36. As further shown in FIG. 4, the ladder switch 36 comprises a resistor bank 37 which allows for the selection of each of a plurality of distinct phantom power voltage outputs, depending on the specific resistor or resistors from the resistor bank 37 which are placed into the circuit via ladder switch 36. As before, the ladder switch 36 is actuable via the variable voltage switch 32, to allow selection of each of a plurality of distinct phantom power voltage outputs over a full range of preselected phantom power voltages. Also as before, and again, by way to example only, a preselected phantom power voltage may be in a range of about 12 to 48 volts DC, or from about 0 to about 48 volts DC, or from about 0 to about 52 volts DC. As further shown in the illustrative embodiment of FIG. 4, the variable voltage phantom power supply module 30 comprises a variable voltage phantom power output 38 through which a distinct preselected phantom power voltage is supplied to an audio channel 23 of a phantom power supply unit 20 of a variable voltage phantom power supply assembly 10 in accordance with the present invention. Looking to the illustrative embodiment of FIG. 1, a preselected phantom power output voltage is displayed on a variable voltage display 39 for each corresponding audio channel 23 of a phantom power supply unit 20. As such, a preselected phantom power voltage to be supplied to one or more audio channel 23 of a variable voltage phantom power supply assembly 10 may be quickly and easily varied by way of a variable voltage controller 34 which is actuated via a variable voltage switch 32 and directly monitored via a variable voltage display 39.

FIG. 9 presents a table illustrative of the performance characteristics attained from various commercially available microphones operated in accordance with the present invention. As may be seen from the table in FIG. 9, the performance characteristic of various microphones are widely varied depending on the voltage of phantom power supplied to the microphone. The table in FIG. 9 also show that even for the same microphone, the performance characteristics are widely varied, once again, depending on the voltage of phantom power supplied to the microphone. This is evident from a comparison of the Low Voltage Characteristics and the High Voltage Characteristics observed for the same microphone operating under the same conditions, with the exception of the voltage of the phantom power supplied to the microphone.

As may be further seen from the table in FIG. 9, each microphone has a unique breakdown, or minimum, voltage requirement in order to operate, at all, as well as low voltage usability threshold at which voltage(s) a microphone will perform at acceptable levels. The table in FIG. 9 is also illustrative of a high voltage above which a particular microphone will cease to operate satisfactorily.

As will be appreciated by those of skill in the art, the table presented in FIG. 9 is merely exemplary of a few different microphones used to create audio recordings utilized in the industry today, but it is by no means intended to be an exhaustive listing of the performance characteristics of the numerous microphones which may be utilized to create audio recordings in conjunction with a variable voltage phantom power supply assembly 10 in accordance with the present invention.

Figure 8:
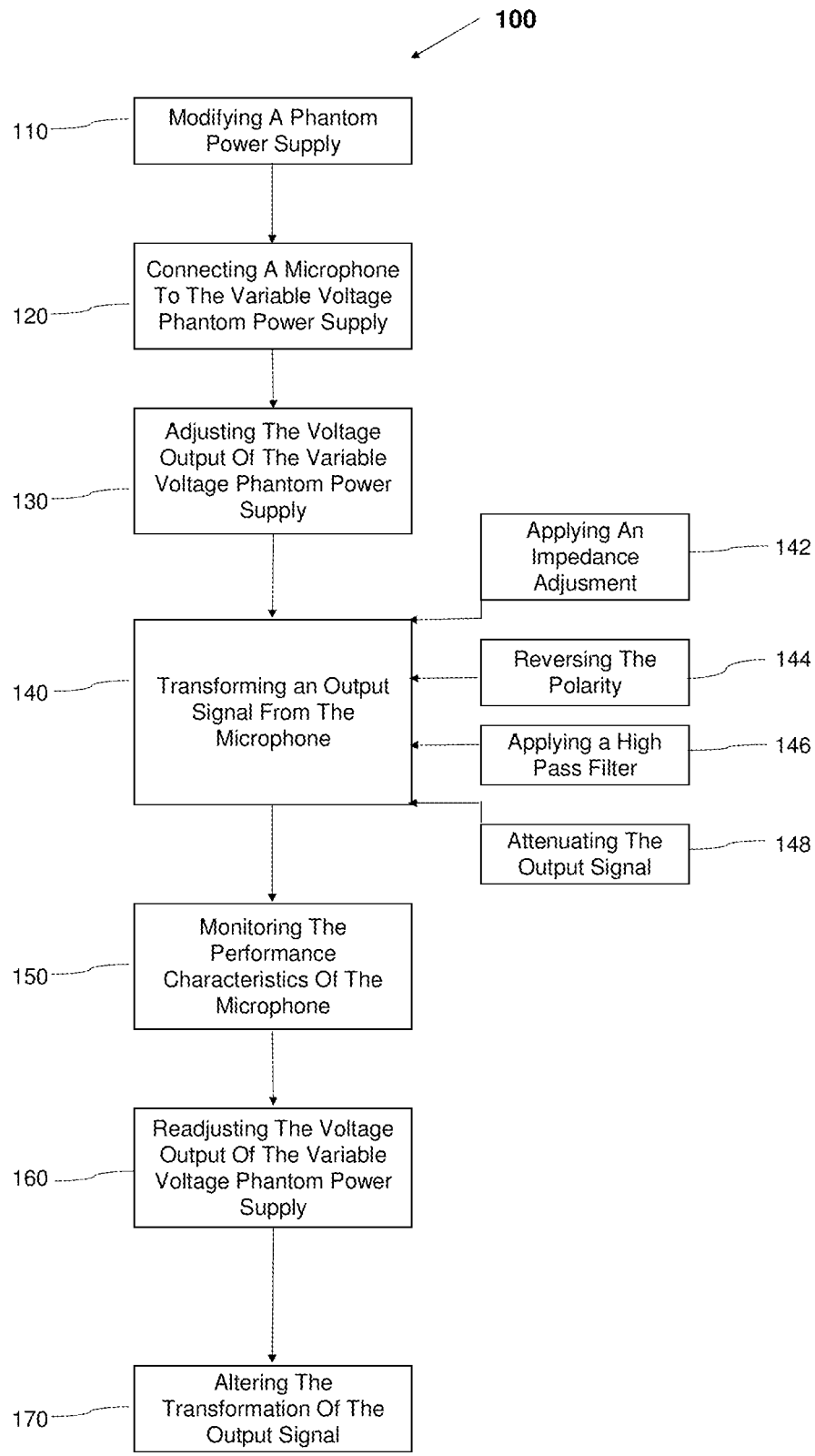
FIG. 8 is a diagrammatic representation of one illustrative embodiment of a method for customizing microphone performance characteristics utilizing a variable phantom power supply in accordance with the present invention.

As previously stated, the present invention is further directed to a method of customizing a microphone's performance characteristics utilizing a variable voltage phantom power supply. FIG. 8 is a diagrammatic representation of one illustrative embodiment of a method for customizing microphone performance characteristics utilizing a variable phantom power supply, generally as shown at 100, in accordance with the present invention.

In accordance with at least one embodiment of the present invention, a method of customizing at least one performance characteristic of a microphone 100 comprises modifying a phantom power supply to provide a variable voltage phantom power output 110, such as, by way of example, a variable voltage phantom power supply assembly 10 as disclosed hereinabove. The present method of customizing at least one performance characteristic of a microphone 100 further comprises connecting a microphone to an input of a variable voltage phantom power supply assembly 120.

As may be seen from the illustrative embodiment of FIG. 8, the present method 100 also includes adjusting the voltage output of the variable voltage phantom power supply to the microphone 130. Once again, with reference to the variable voltage phantom power supply assembly 10 disclosed herein, this step may easily be accomplished with via a variable voltage switch 32 which actuates a variable voltage controller 34 of a variable voltage phantom power supply module 30.

At least one embodiment of the present method of customizing at least one performance characteristic of a microphone 100 includes the step of transforming an output signal from a microphone 140. As may be seen from the illustrative embodiment of FIG. 8, transforming an output signal from a microphone may include one or more of: applying an impedance adjustment to an output signal from a microphone 142; reversing the polarity of an output signal from a microphone 144; applying a high pass filter to an output signal from a microphone; and/or attenuating an output signal from a microphone 148. As will be appreciated by those of skill in the art, each of these steps may be accomplished via one or more of the ancillary circuits 24 disclosed and described hereinabove.

Looking once again to the illustrative embodiment of FIG. 8, the present method of customizing at least one performance characteristic of a microphone 100 further comprises monitoring the performance characteristics of the microphone 150 at a particular preselected phantom power voltage. The table presented in FIG. 9 is illustrative of the results achieved by monitoring the performance characteristics of a plurality of microphones 150 operating at different preselected phantom power voltages in accordance with the present invention.

Further, the present method 100 provides for readjusting the voltage output of the variable voltage phantom power supply to the microphone 160 to obtain at least one desired performance characteristic of the microphone. As before, utilizing a variable voltage phantom power supply assembly 10 disclosed herein, this step is easily accomplished via a variable voltage switch 32 to actuate a variable voltage controller 34 of a variable voltage phantom power supply module 30. More in particular, one or more performance characteristics of a particular microphone may be observed at each of a plurality of preselected phantom power voltages until one or more desired performance characteristics are achieved and/or optimized.

With reference once again to FIG. 8, in at least one embodiment, the present method of customizing at least one performance characteristic of a microphone 100 also includes altering the transformation of an output signal from a microphone 170. As before, transforming an output signal from a microphone may include one or more of: applying an impedance adjustment to an output signal from a microphone 142; reversing the polarity of an output signal from a microphone 144; applying a high pass filter to an output signal from a microphone; and/or attenuating an output signal from a microphone 148. As will be appreciated by those of skill in the art, each of these steps may be accomplished via one or more of the ancillary circuits 24 disclosed and described hereinabove.

Since many modifications, variations and changes in detail can be made to the described embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A variable voltage phantom power supply assembly operable to customize at least one performance characteristic of an external audio component disposed in communication with said assembly via an audio cable, said assembly comprising:
   a phantom power supply unit having an alternating current power input,
   said phantom power supply unit comprising at least one audio channel, wherein the external audio component is connected to said at least one audio channel via the audio cable,
   a variable voltage phantom power supply module comprising a phantom power supply circuit to convert said alternating current power input into any of a plurality of phantom power voltages which are continuous from 0 volts DC to 52 volts DC, wherein the plurality of phantom power voltages are selectable to customize the performance characteristics of the active electronics of a microphone by supplying voltage to active electronics of the microphone, which voltage is at or above the breakdown voltage of said active electronics of the microphone, wherein the microphone is specified by its manufacturer to be operated at a predefined phantom power voltage supplied through a balanced audio connector,
   said variable voltage phantom power supply module further comprising a variable voltage controller operable to select one of said plurality of phantom power voltages to be generated by said phantom power supply circuit, and
   said variable voltage phantom power supply module including a variable voltage phantom power output to transmit a selected one of said plurality of phantom power voltages generated by said phantom power supply circuit to the external audio component through the audio cable connecting the external audio component to said phantom power supply unit.

2. The variable voltage phantom power supply unit as recited in claim 1 wherein said variable voltage controller comprises a potentiometer.

3. The variable voltage phantom power supply unit as recited in claim 1 wherein said variable voltage controller comprises a ladder switch.

4. A variable voltage phantom power supply assembly operable to customize at least one performance characteristic of an external audio component disposed in communication with said assembly via a balanced audio cable, said assembly comprising:
   a phantom power supply unit having an alternating current power input,
   said phantom power supply unit comprising at least one audio channel, wherein the external audio component is connected to said at least one audio channel via the balanced audio cable,
   said phantom power supply unit further comprising at least one ancillary circuit selected from the group consisting of an impedance adjustment circuit, a reverse polarity circuit, a mute circuit, a high pass filter circuit, and an attenuation circuit,
   a variable voltage phantom power supply module comprising a phantom power supply circuit to convert said alternating current power input into any of a plurality of phantom power voltages, wherein the plurality of phantom power voltages are selectable to customize the performance characteristics of the external audio component by supplying voltage at or above the breakdown voltage of active electronics of said external audio component, wherein said external audio component is specified by its manufacturer to be operated at a predefined phantom power voltage supplied through the balanced audio cable,
   said variable voltage phantom power supply module further comprising a variable voltage controller operable to select one of said plurality of phantom power voltages to be generated by said phantom power supply circuit, and
   said variable voltage phantom power supply module including a variable voltage phantom power output to transmit a selected one of said plurality of phantom power voltages generated by said phantom power supply circuit to the external audio component through the balanced audio cable connecting the external audio component to said phantom power supply unit.

5. The variable voltage phantom power supply unit as recited in claim 4 wherein said ancillary circuit comprises an impedance adjustment circuit.

6. The variable voltage phantom power supply unit as recited in claim 4 wherein said ancillary circuit comprises a reverse polarity circuit.

7. The variable voltage phantom power supply unit as recited in claim 4 wherein said ancillary circuit comprises a mute circuit.

8. The variable voltage phantom power supply unit as recited in claim 4 wherein said ancillary circuit comprises a high pass filter circuit.

9. The variable voltage phantom power supply unit as recited in claim 4 wherein said ancillary circuit comprises an attenuation circuit.

10. A method of customizing at least one performance characteristic of a microphone specified by its manufacturer to operate at a predefined phantom power voltage supplied by a balanced audio connector, the method comprising:
    connecting the microphone to an input jack of a variable voltage phantom power supply assembly via a balanced audio cable, wherein the variable voltage phantom power assembly includes a variable voltage phantom power supply module to convert an alternating current power input into any of a plurality of preselected phantom power voltages which are continuous from 0 volts DC to 52 volts DC and are supplied on the balanced cable,
    selecting one of the plurality of preselected phantom power voltages to supply to the microphone to customize the performance characteristics of a microphone by supplying voltage at or above the breakdown voltage of active electronics of said microphone, supplying the preselected phantom power voltage to the microphone via the audio cable to power the microphone, monitoring the performance characteristics of the microphone, and adjusting the preselected phantom power voltage supplied to the active electronics of the microphone to obtain at least one desired performance characteristic of the microphone.

11. The method of claim 10, further comprising transforming the output signal from the microphone by applying an impedance adjustment to the input signal of the non-microphone.

12. The method of claim 10, further comprising transforming the output signal from the microphone by reversing the polarity of the input signal from the microphone.

13. The method of claim 10, further comprising transforming the output signal from the microphone by applying a high pass filter to the input signal from the microphone.

14. The method of claim 10, further comprising transforming the output signal from the microphone by attenuating the input signal from the microphone.

15. A variable voltage phantom power supply assembly operable to customize at least one performance characteristic of an external audio component disposed in communication with said assembly via an audio cable, said assembly comprising:

a phantom power supply unit having an alternating current power input, said phantom power supply unit comprising at least one audio channel having an input jack and an output jack, wherein the external audio component is connected to said input jack of said at least one audio channel via the audio cable, wherein said phantom power supply unit comprises a plurality of audio channels, said phantom power supply unit further comprising an impedance adjustment circuit, a reverse polarity circuit, a mute circuit, a high pass filter circuit, and an attenuation circuit, a variable voltage phantom power supply module comprising a phantom power supply circuit to convert said alternating current power input into any of a plurality of phantom power voltages, wherein said plurality of phantom power voltages are continuous from 0 volts DC to 52 volts DC, wherein the plurality of phantom power voltages are selectable to customize the performance characteristics of a microphone by supplying voltage at about the breakdown voltage of active electronics of said microphone, wherein said microphone is specified by its manufacturer to be operated at a predefined phantom power voltage supplied by a balanced audio connector, said variable voltage phantom power supply module further comprising a variable voltage controller operable to select one of said plurality of phantom power voltages to be generated by said phantom power supply circuit, wherein said variable voltage controller comprises a potentiometer, wherein said variable voltage controller comprises a ladder switch, and said variable voltage phantom power supply module including a variable voltage phantom power output to transmit a selected one of said plurality of phantom power voltages generated by said phantom power supply circuit to the external audio component through the audio cable connecting the external audio component to said phantom power supply unit.

16. A variable voltage phantom power supply assembly operable to customize at least one performance characteristic of an external audio component disposed in communication with said assembly via an audio cable, said assembly comprising:

a phantom power supply unit having an alternating current power input, said phantom power supply unit comprising at least one audio channel, wherein the external audio component is connected to said at least one audio channel via the audio cable, a variable voltage phantom power supply module comprising a phantom power supply circuit to convert said alternating current power input into any of a plurality of phantom power voltages which are continuous from 0 volts DC to 52 volts DC, wherein the plurality of phantom power voltages are selectable to customize the performance characteristics of the microphone by supplying voltage to active electronics of the microphone, which voltage is at or above the breakdown voltage of said active electronics of the microphone, wherein the microphone is specified by its manufacturer to be operated at a predefined phantom power voltage supplied through a balanced audio connector, said variable voltage phantom power supply module further comprising a variable voltage controller operable to select one of said plurality of phantom power voltages to be generated by said phantom power supply circuit, and said variable voltage phantom power supply module including a variable voltage phantom power output to transmit a selected one of said plurality of phantom power voltages generated by said phantom power supply circuit to the external audio component through the audio cable connecting the external audio component to said phantom power supply unit.

* * * * *